Figure 1:
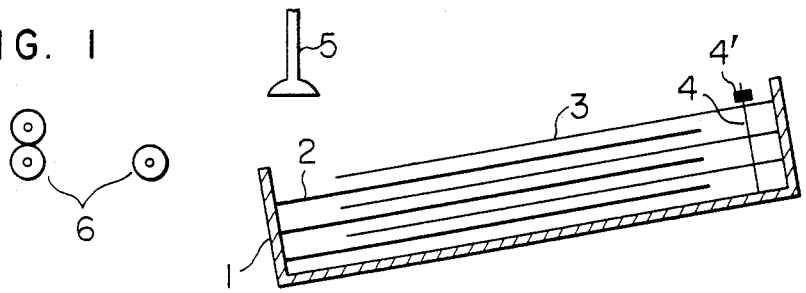

United States Patent [19]

Senga et al.

[11] Patent Number: 4,502,677
[45] Date of Patent: Mar. 5, 1985

[54] METHOD FOR FEEDING RECORDING SHEET MATERIALS

[75] Inventors: Takao Senga; Shigeyoshi Suzuki; Jun Yamada; Sadao Kuriu, all of Nagaokakyo, Japan

[73] Assignees: Mitsubishi Paper Mills, Ltd., Tokyo; Dainippon Screen Mfg., Co., Ltd., Kyoto, both of Japan

[21] Appl. No.: 423,302

[22] Filed: Sep. 24, 1982

[30] Foreign Application Priority Data

Nov. 26, 1981 [JP] Japan ............................... 56-189698
Jul. 8, 1982 [JP] Japan ............................... 57-118923

[51] Int. Cl.³ .............................................. B65H 3/34
[52] U.S. Cl. ..................................... 271/104; 271/168
[58] Field of Search ................. 271/1, 90, 91, 93, 104, 271/123, 145, 168, 9; 414/42

[56] References Cited

U.S. PATENT DOCUMENTS

Re. 30,792 11/1981 Schmidt ............................ 271/145
1,414,909 5/1922 Wasson ............................. 221/89
3,360,258 12/1967 Nix ................................... 271/168
3,512,479 5/1970 McHenry .............................. 271/9
3,520,531 7/1970 Tajima .................................. 271/9

Primary Examiner—Richard A. Schacher
Attorney, Agent, or Firm—Cushman, Darby & Cushman

[57] ABSTRACT

Image recording sheet materials having a relatively hard support, e.g., printing plate sheet materials, can be simply, efficiently, automatically fed to a subsequent step without damaging a photo-sensitive surface by the present feeding method which comprises piling plural units each of which comprises a combination of an image recording sheet material having a relatively hard support and a spacing paper put on said sheet material in such a manner that the leading edge portion of the sheet material protrudes beyond the leading edge of the spacing paper and the trailing edge portion of the spacing paper protrudes beyond the trailing edge of the sheet material and the trailing edge portion of the spacing paper is held so as not to be fed and applying a feeding means to the leading edge portion of said sheet material to feed only the sheet materials to a subsequent step.

12 Claims, 6 Drawing Figures

METHOD FOR FEEDING RECORDING SHEET MATERIALS

This invention relates to a method for feeding recording sheet materials, especially those having a hard support such as an aluminum plate (preferably, photo-sensitive printing plate materials) to the subsequent steps, normally, to an exposing step.

There are known various image recording materials having a photo-sensitive substance on a support. The photo-sensitive substances may be roughly classified into silver salts (silver halide emulsions) and non-silver salts (e.g., inorganic or organic photo-conductive substances for electrophotography, diazonium compounds, photo-sensitive resins, etc.) and suitable photo-sensitive substances may be chosen depending on purpose and use.

It is also known to use image recording materials as printing plate materials. As the support for the image recording materials, there are various supports such as paper, polyolefin resin-coated paper, various films, metallic plates such as aluminum or zinc, glass plates, composites thereof, etc. When especially high printing endurance is required as a support for printing plates, a support which is less elastic and harder than paper, e.g., an aluminum plate is used. For example, representative of those practically used are the so-called presensitized plates (PS plates) which comprise a photo-sensitive layer containing diazonium compound provided on an anodized aluminum plate; printing plates according to electro photographic process in which is provided a photo-sensitive layer containing zinc oxide, selenium or various organic photo-conductive substances; printing plates in which silver images transferred according to silver complex diffusion transfer process are used as printing ink receptive areas, etc.

Other practically used printing plates are, for example, lithographic printing plates made by electro photographic process using zinc oxide and silver salt lithographic plates made by the silver complex diffusion transfer process, the hardening development process, etc. which use paper or polyolefin resin-coated paper as a support. They have high photo-sensitivity and so are suitable for direct plate-making. Thus, it is possible to automate the steps of from exposure to plate-making. The materials are fed in the form of roll and can be cut by an automatic cutter.

However, in the case of relatively hard supports which cannot be made into a roll or cannot be readily automatically cut, they must be supplied as a sheet. Sheet materials of such relatively hard support are liable to damage of their photo-sensitive layer during production, transportation or use thereof. In order to prevent the damages of the photo-sensitive layer and further prevent blocking of the sheet materials and deterioration of photo-sensitive characteristics, a sheet of paper is put on the surface of photo-sensitive layer of the sheet materials (this combination of a sheet material and a paper is called "unit" hereinafter) and a plurality of these units are packaged. Said paper is commonly called "spacing paper" and this term will be used in this specification, too.

In the case of the conventional packages of plural units as mentioned above, for example, in the case of PS plates, the spacing papers are manually removed at every exposing operation and after removal of the spacing paper, exposing is carried out. However, such manual operation is troublesome. Furthermore, employment of such plural units has prevented production of printing plate materials for direct plate-making by automation as referred to hereinbefore.

If there is a method which can feed to an exposing step only the printing plate sheet materials of the plural units mounted on an automatic plate-making apparatus, such method will be especially useful for direct printing plate making according to electro photographic process or silver salt process. Moreover, such a feeding method will accelerate automation of production of PS plates and the like. Furthermore, such feeding method will make it possible to automate the production of not only the printing plates, but the image recording materials.

The object of this invention is to provide a method for efficiently feeding recording sheet materials having a relatively hard support without damaging the photo-sensitive layer and without any man power for this purpose.

Another object of this invention is to provide a simple and highly efficient method for feeding printing plate sheet materials having relatively hard support for direct plate-making in an automatic plate-making apparatus with safe keeping qualities of the resultant printing plates.

Figure 2:
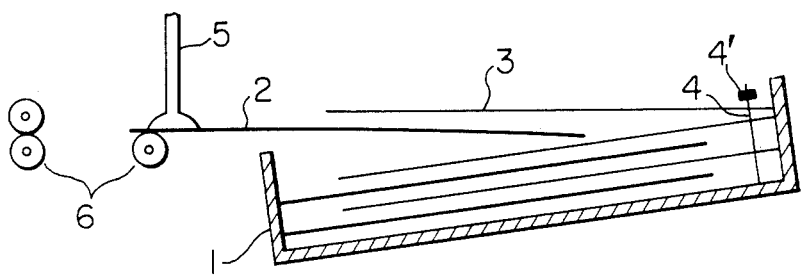
Figure 3:
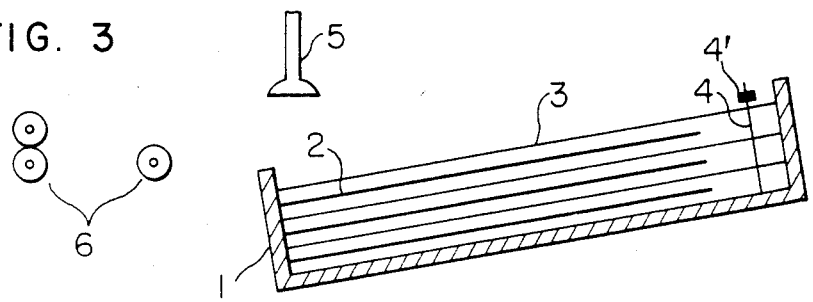
Figure 4:
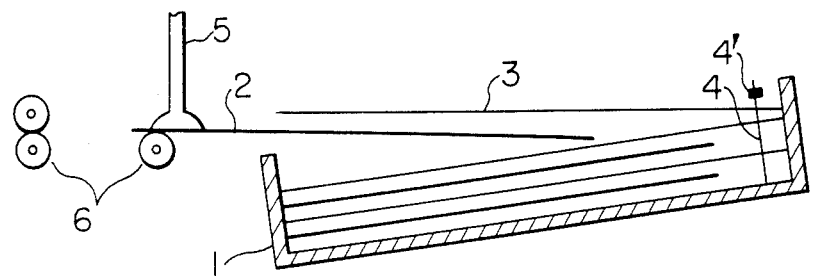
Figure 5A:
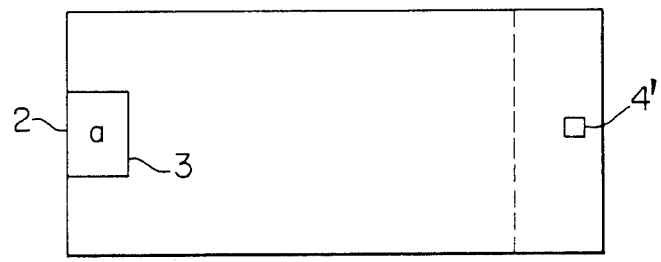
Figure 5B:
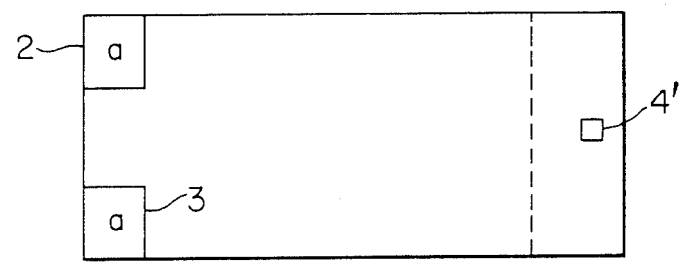

The accompanying drawings illustrate the feeding method of this invention. FIGS. 1 and 3 illustrate the state before feeding, FIGS. 2 and 4 illustrate the state during feeding and FIGS. 5A and 5B are top views of the unit.

That is, according to this invention, there is provided a method for feeding image recording sheet materials which comprises piling plural units each of which comprises a combination of an image recording sheet material having a relatively hard support and a spacing paper put on said sheet material in such a manner that the leading edge portion of the sheet material protrudes beyond the leading edge of the spacing paper and the trailing edge portion of the spacing paper protrudes beyond the trailing edge of the sheet material and the trailing edge portion of the spacing paper is held so that this spacing paper cannot be fed with the sheet material and applying a feeding means to the leading edge portion of said sheet material to feed only the sheet material.

Furthermore, the leading edge of the sheet material and the leading edge of the spacing paper can be aligned when a cut portion is provided in the leading edge portion of the spacing paper. Thus, the units can be automatically and efficiently produced. That is, there is also provided a method for feeding image recording sheet materials which comprises piling plural units each of which comprises a combination of an image recording sheet material having a relatively hard support and a spacing paper put on said sheet material in such a manner that the trailing edge portion of the spacing paper protrudes beyond the trailing edge of the sheet material, said spacing paper having a cut portion in the leading edge portion so that the sheet material thereunder can receive feeding means at the exposed portion and the trailing edge portion of the spacing paper being held so that this spacing paper cannot be fed with the sheet material and applying a feeding means to the exposed portion of the sheet material to feed only the sheet material.

The method of this invention will be further explained with reference to the drawings which diagrammatically illustrate only the feeding portion.

FIG. 1 shows the state before feeding the recording sheet material 2, FIG. 2 shows the state during the feeding of the sheet materials to carrying rolls 6, FIG. 3 shows another embodiment of this invention where a cut portion is provided in the leading edge portion of the spacing paper and the leading edge of the sheet material and that of the spacing paper are aligned and FIG. 4 shows the state of feeding the sheet material provided as shown in FIG. 3 to the carrying rolls 6. In tray 1 there are provided one or more holding rods 4 for holding the trailing edge portion of spacing paper 3 so that the spacing paper cannot be fed and set screw 4' for preventing the spacing paper from escaping from the holding rod. FIGS. 5(A) and 5(B) are top views of the unit comprising recording sheet material 2 and spacing paper 3 as shown in FIG. 3. Portion a corresponds to the cut portion of spacing paper 3 and it is shown that sheet material 2 of that portion just below the spacing paper 3 is seen. Suction chuck 5 as a feeding means is applied to said portion a of recording sheet material 2. The trailing edge portion of spacing paper 3 protrudes beyond the trailing edge of recording sheet material 2 and spacing paper 3 is held at its trailing edge portion by holding rod 4 which passes through a hole made in the trailing edge portion of spacing paper 3. If necessary, escape of the spacing paper can be prevented by set screw 4'.

For providing the plural units as shown in FIG. 1, the leading edge portion of recording sheet material 2 is protruded beyond the leading edge of spacing paper 3, the length of the protruded leading edge portion of the sheet material 2 is at least such that suction chuck 5 can be applied thereto. On the other hand, the trailing edge portion of spacing paper 3 protrudes beyond the trailing edge of recording sheet material 2 and is held by holding rod 4 which passes through a hole made in the trailing edge portion of spacing paper 3. If necessary, escape of the spacing paper can be prevented by set screw 4'.

In order to transfer the recording sheet material 2 from the plural units provided as shown in FIG. 1 and FIG. 3 to an exposing section through carrying rolls 6, the leading edge portion (cut portion a in FIG. 3) of recording sheet material 2 is lifted by suction chuck 5 and simultaneously the sheet material is fed to carrying rolls 6 by this suction chuck (FIGS. 2 and 4). The trailing edge of recording sheet material 2 slides over spacing paper 3 thereunder and so it does not damage the surface of the photo-sensitive layer of recording sheet material 2 thereunder. If necessary, it is also possible to apply another suction chuck to the trailing portion of the sheet material during the feeding of the sheet material by suction chuck 5. After feeding of all recording sheet materials, only the spacing papers remain in tray 1.

The accompanying drawings show one preferred embodiment of this invention where the plural units (and the tray) are inclined downwardly at the leading edge with reference to the plane axis of recording sheet material 2 (horizontal plane axis in the drawings). According to this method, the leading edges of recording sheet materials 2 align along the wall surface of tray 1. This is suitable for carrying out the feeding method of this invention and the leading edge portion of recording sheet material 2 is lifted and the sheet material can be horizontally fed. However, tray 1 may be placed in a horizontal position. Furthermore, tray 1 is not necessarily needed and may be merely a stand on which the plural units are piled. Moreover, tray 1 may be a cassette which contains the plural units and whose upper front part is preferably an openable or removable lid. The cassette may be of any materials, but preferably of metals or plastics.

The feeding means for recording sheet material 2 is preferably suction chuck 5 as shown in the drawings, but may be of roller system known as a conveying means. The suction chuck system is also known as a conveying means. One or two or more feeding means may be used.

Means for holding the trailing edge portion of spacing paper 3 is not limited to holding rod 4 as shown in the drawings. When the thickness of the plural units is not so large, it is not so difficult to put together the trailing edge portions of spacing paper 3 and hold them. Simply, the trailing edge portion of spacing paper 3 may be merely put together and held by a stapling, etc. and preferably this is held to tray 1 by adhesive tapes. Furthermore, holding rod 4 shown in the drawings may be substituted by a pin or a nail.

By providing a cut portion in the leading edge portion of spacing paper 3, the leading edge of sheet material 2 and that of spacing paper 3 can be aligned at the time of assembling the units and thus the units can be automatically made with cutting spacing paper 3 by an automatic cutter.

Since the units can be automatically assembled by aligning the leading edge of recording sheet material 2 and that of spacing paper 3 as mentioned above, operability af the assembly of spacing papers increases and moreover since most of the surface of the under recording sheet 2 is physically isolated by spacing paper 3 having a cut portion, damage of the edge portion of recording sheet material 2 can be prevented.

The cut portion is provided preferably at the center of the leading edge portion of the spacing paper at such a size as the feeding means can be applied to the exposed portion of the sheet material, but there is no limitation as to the position thereof, number (it may be provided at both edges) (FIG. 5(B)) or shape. For example, they may be such that shown in FIGS. 5(A) and 5(B).

Spacing paper 3 used in this invention is usually an ordinary paper made from wood pulp, but there is no limitation in materials as long as they meet the object of the spacing paper for the recording sheet materials. The term "spacing paper" does not mean only ordinary paper, but includes, for example, thin sheets of synthetic resins such as polyethylene, polypropylene, etc. In the case of the embodiment as shown in FIG. 1, length of spacing paper 3 may be identical with or different from that of recording sheet material 2. (Too short a spacing paper does not meet the original object as a spacing paper.)

The supports of the recording sheet materials used in this invention are especially preferably metallic supports such as aluminum sheet, composites of aluminum and film and the like. However, the supports used in this invention include relatively hard supports such as reinforced papers, thick or reinforced synthetic resin films which must be made into sheet because they cannot be rolled or are difficult to cut by automatic cutters like said metallic supports.

The image recording layer provided on the relatively hard support can be known ones as mentioned hereinbefore. When the support is a hard support such as an aluminum support, it is preferably an image recording layer for printing plates. However, it may be for use as image forming materials comprising an aluminum sheet which contains silver halide in fine pores formed by anodization.

The recording sheet materials fed by the method of this invention are usually transferred to an exposing step where they are imagewise exposed. Moreover, in the same apparatus, treatments such as development, fixing, washing with water, etc. may be successively carried out and if necessary, desensitizing treatment, gum coating treatment, etching treatment (e.g., a treatment for removing non-toner image areas of printing plates which use organic photoconductive substances), etc. may also be carried out. Of course, some of these steps may be carried out in other apparatus because of problems in design of the apparatuses.

According to the feeding method of this invention, the recording sheet materials can be simply, efficiently, automatically and successively fed without damaging the photo-sensitive surface even if the size of the sheet material is large.

What is claimed is:

1. A method for feeding image recording sheet materials comprising the steps of:

piling up alternately on a tray a plurality of image recording sheet materials, each of which has a relatively hard support, and a plurality of spacing sheets with each image recording sheet material and each spacing sheet having a leading edge, the leading edge of said image recording sheet material protruding beyond said leading edge of adjacent spacing sheets and with said image recording sheet materials and said spacing sheets each having trailing edge portions with said trailing edge portions of said spacing sheets protruding beyond the trailing edge portions of said image recording sheet materials;

fixing said protruded trailing edge portions of each said spacing sheet whereby said spacing sheets are not fed when said image recording sheet materials are fed;

holding a said protruding leading edge portion of a said image recording sheet material by a feeding means;

and feeding only said image recording sheet materials by said feeding means to a subsequent position.

2. A method for feeding image recording sheet materials, of the type having a relatively hard support, comprising the steps of piling, on a tray, alternately, sheets of image recording materials and spacing sheets with each spacing sheet having a leading edge including a cut-out portion and a trailing edge, each image recording material sheet having a leading and a trailing edge, the piling being carried out with a trailing edge portion of a spacing sheet protruding beyond the trailing edge of the adjacent image recording sheets, fixing only the protruding trailing edge of the spacing sheets so that the spacing sheets will not be fed when the image recording sheets are fed, holding the portion of the leading edge of the image recording material sheets in the area thereof that is exposed through the cut-out portion of a superimposed spacing sheet, and feeding only the image recording material sheets by a feeding means to a subsequent position.

3. A method for feeding recording sheet material according to claim 1 or 2, wherein the recording sheet materials are sheet materials for printing plates.

4. A method for feeding recording sheet materials according to claim 1 or 2, wherein the support is a metal sheet such as aluminum sheet.

5. A method for feeding recording sheet materials according to claim 1 or 2, wherein the plural units are placed so that they are inclined downwardly at the leading edges against the axis of the feeding plane.

6. A method for feeding recording sheet materials according to claim 1 or 2 wherein the feeding means is a suction chuck.

7. A method for feeding recording sheet materials according to claim 5, wherein the image recording sheet materials and the spacing sheets are placed in a tray inclined downwardly at the leading edge.

8. A method for feeding recording sheet materials according to claim 1 or 2 wherein the subsequent step is an exposing section.

9. A method for feeding image recording sheet materials according to claim 1, wherein the spacing sheets are synthetic resin sheets.

10. A method for feeding image recording sheet materials according to claim 2, wherein said spacing sheets are synthetic resin sheets.

11. A printing plate making apparatus including means for feeding recording sheets of the type having a relatively hard support where the recording material sheets are piled alternately with spacing paper with each said sheet and each said paper having a leading edge and a trailing edge and with the leading edge of the recording sheet protruding beyond the leading edge of the adjacent spacing paper and with the trailing edge of the spacing paper protruding beyond the trailing edge of adjacent recording sheets, said apparatus further including means for holding the trailing edge of each said spacing sheets to prevent feeding of said spacing sheets when said feeding means engages and feeds a said recording sheet to a subsequent position.

12. A printing plate making apparatus which includes means for feeding recording sheet materials which are piled alternately with spacing paper, said recording sheets having a relatively hard support and each said recording sheet and spacing paper having a leading edge and a trailing edge, said spacing paper having a cut-out portion along said leading edge thereof, with said image recording sheets and said spacing papers being piled in a tray with the trailing edge portion of the spacing papers protruding beyond the trailing edge of said recording sheets, said apparatus further including means for holding said spacing paper so as to prevent feeding said spacing paper when said feeding means feeds the leading edge portion of said recording sheets to feed a said recording sheet to a subsequent position.

* * * * *